United States Patent
Atsatt et al.

(10) Patent No.: US 10,659,052 B2
(45) Date of Patent: *May 19, 2020

(54) REGIONAL PARTIAL RECONFIGURATION OF A PROGRAMMABLE DEVICE

(71) Applicant: Intel Corproration, Santa Clara, CA (US)

(72) Inventors: Sean R. Atsatt, Santa Cruz, CA (US); Andrew Draper, Bucks (GB)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/277,916

(22) Filed: Feb. 15, 2019

(65) Prior Publication Data

US 2019/0199354 A1 Jun. 27, 2019

Related U.S. Application Data

(63) Continuation of application No. 15/638,151, filed on Jun. 29, 2017, now Pat. No. 10,218,359.

(51) Int. Cl.
| | |
|---|---|
| *H03K 19/17756* | (2020.01) |
| *G06F 15/78* | (2006.01) |
| *G06F 30/34* | (2020.01) |
| *G06F 9/455* | (2018.01) |
| *G06F 9/50* | (2006.01) |
| *H03K 19/17736* | (2020.01) |

(52) U.S. Cl.
CPC ... *H03K 19/17756* (2013.01); *G06F 9/45558* (2013.01); *G06F 9/5077* (2013.01); *G06F 15/7867* (2013.01); *G06F 30/34* (2020.01); *H03K 19/17736* (2013.01); *G06F 2009/45583* (2013.01)

(58) Field of Classification Search
None
See application file for complete search history.

(56) References Cited

U.S. PATENT DOCUMENTS

| | | | |
|---|---|---|---|
| 7,669,163 B1 | 2/2010 | Camilleri et al. | |
| 8,560,996 B1 | 10/2013 | Brebner et al. | |
| 8,719,750 B1 | 5/2014 | Balzli, Jr. | |
| 9,257,987 B1 * | 2/2016 | Molson | H03K 19/17728 |
| 9,576,095 B1 | 2/2017 | Hew et al. | |
| 9,584,130 B1 * | 2/2017 | Weber | H03K 19/17756 |
| 9,825,635 B2 * | 11/2017 | Munday | H03K 19/17756 |
| 2010/0283505 A1 * | 11/2010 | Koch | G06F 15/7867 326/41 |

* cited by examiner

*Primary Examiner* — Minh D A
*Assistant Examiner* — James H Cho
(74) *Attorney, Agent, or Firm* — Fletcher Yoder PC

(57) ABSTRACT

Devices and methods for reconfiguring a programmable fabric include identifying resources in a programmable fabric of the programmable device as belonging to a partition. Reconfiguring the programmable fabric also includes creating a mask for the partition that indicates that the identified resources belong to the partition. Reconfiguring the partition also includes reconfiguring resources, via a configuration controller, in programmable fabric associated with the partition using the mask without changing resources associated with other partitions in the programmable fabric.

20 Claims, 6 Drawing Sheets

REGIONAL PARTIAL RECONFIGURATION OF A PROGRAMMABLE DEVICE

CROSS-REFERENCE TO RELATED APPLICATIONS

Under 35 U.S.C. § 120, this application is a continuation of U.S. patent application Ser. No. 15/638,151, entitled "Regional Partial Reconfiguration of a Programmable Device," filed on Jun. 29, 2017, which is incorporated by reference herein in its entirety for all purposes.

BACKGROUND

The present disclosure relates generally to configuration of programmable devices, such as field programmable gate arrays (FPGAs). More particularly, the present disclosure relates to partial reconfiguration of programmable devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Modern electronics such as computers, portable devices, network routers, data centers, Internet-connected appliances, and more, tend to include at least one integrated circuit (IC) device. Integrated circuit (IC) devices take a variety of forms, including processors, memory devices, and programmable devices, to name only a few examples. A field programmable gate array (FPGA) is one type of programmable device. utilizing integrated circuits. Programmable devices may include logic that may be programmed (e.g., configured) after manufacturing to provide a wide variety of functionality that based on various design possible within the programmable devices. Thus, programmable devices contain programmable logic (e.g., logic blocks) that may be configured to perform a variety of functions on the devices, according to a configured design. The IC devices may be configured in numerous difference configurations. These configurations are generally loaded into the IC devices. However, partially reconfiguring the programmable device may be problematic for situations where multiple users share a common device but distinct portions of the device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for emulating programmable initial conditions via partial reconfiguration regions/partitions in an IC (e.g., an FPGA). Accordingly, some designs may target partial reconfiguration regions without changing configurations of adjacent regions. For instance, a server having multiple virtual machines may enable a user to change a region corresponding to a region allocated to the user without enabling the user to change other regions. A configuration controller, before or during runtime, may generate a mask for a partition that indicates resources to which the partition is associated. The configuration controller may use the mask to reconfigure the partition without changing other partitions.

Various refinements of the features noted above may be made in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to partial reconfiguration of only a portion of a programmable fabric using a mask to determine which resources may be changed by the partition. By using a mask, a central authority (e.g., server owner) may authenticate writing using the masks without having knowledge of what is actually in the partition or its configuration. Thus, proprietary information may be used without sharing the information with the central authority. Furthermore, any updates to the configuration may be implemented without re-checking with the central authority regarding permissions.

While the techniques of this disclosure are described chiefly in the context of reconfigurable devices, such as programmable logic devices with field programmable gate array (FPGA) fabric, this is meant to be illustrative and not limiting. Indeed, the filtering circuitry of this disclosure may be implemented in other integrated circuit devices. For example, other types of integrated circuits, such as applicant-specific integrated circuits (ASICs), microprocessors, memory devices, transceivers, and the like, that may include regions of programmable logic.

Figure 1:
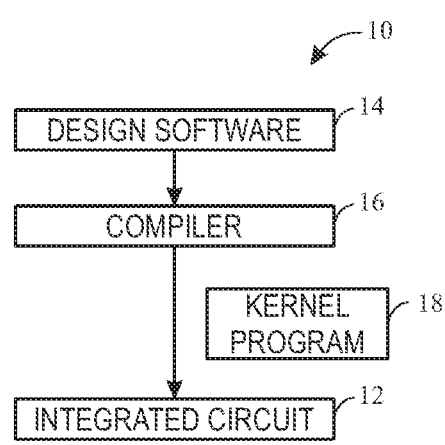
FIG. 1 is a block diagram of a system that utilizes partial reconfiguration masking, in accordance with an embodiment.

With the foregoing in mind, FIG. 1 illustrates a block diagram of a system 10 for configuring a programmable device. A designer may implement functionality on an integrated circuit, such as a reconfigurable integrated circuit 12, such as a field programmable gate array (FPGA). A designer may implement a circuit design to be programmed onto the IC 12 using design software 14, such as a version of Quartus by Altera™. The design software 14 may use a compiler 16 to generate a low-level circuit-design, which may be provided as a kernel program, sometimes known as a program object file or bitstream, that programs the integrated circuit 12. That is, the compiler 16 may provide machine-readable instructions representative of the circuit design to the IC 12.

Figure 2:
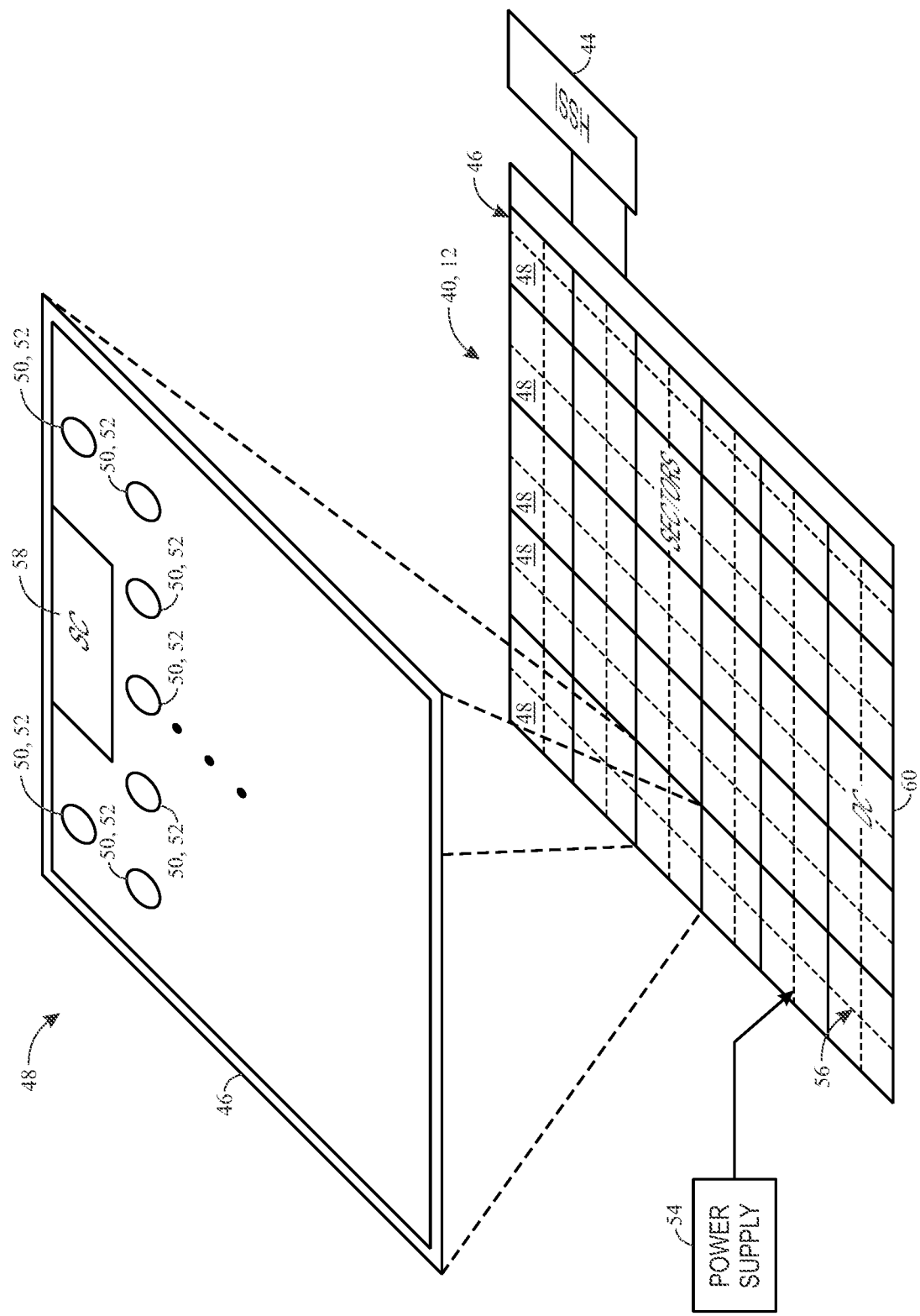
FIG. 2 is a block diagram of a programmable logic device that may include partial reconfiguration logic, in accordance with an embodiment.

The IC 12 may be a programmable logic device, such as a field programmable gate array (FPGA) 40, as shown in FIG. 2. For the purposes of this example, the FPGA 40 is referred to as a FPGA, though it should be understood that the device may be any suitable type of programmable logic device (e.g., an application-specific integrated circuit and/or application-specific standard product). In one example, the FPGA 40 is a sectorized FPGA of the type described in U.S. Patent Publication No. 20160049941, "Programmable Circuit Having Multiple Sectors," which is incorporated by reference in its entirety for all purposes.

In the example of FIG. 2, the FPGA 40 may include transceiver circuitry 44 for driving signals off of the FPGA 40 and for receiving signals from other devices. Interconnection resources 46 may be used to route signals, such as clock or data signals, through the FPGA 40. The FPGA 40 of FIG. 2 is sectorized, meaning that programmable logic resources may be distributed through a number of discrete programmable logic sectors 48. Each programmable logic sector 48 may include a number of programmable logic elements 50 having operations defined by configuration memory 52 (e.g., configuration random access memory (CRAM)). The programmable logic elements 50 may include combinational or sequential logic circuitry. For example, the programmable logic elements 50 may include look-up tables, registers, multiplexers, routing wires, and so forth. A designer may program the programmable logic elements 50 to perform a variety of desired functions. A power supply 54 may provide a source of voltage and current to a power distribution network (PDN) 56 that distributes electrical power to the various components of the FPGA 40. Operating the circuitry of the FPGA 40 causes power to be drawn from the power distribution network 56.

There may be any suitable number of programmable logic sectors 48 on the FPGA 40. Indeed, while 29 programmable logic sectors 48 are shown here, it should be appreciated that more or fewer may appear in an actual implementation (e.g., in some cases, on the order of 50 to 100 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60, and may read data from and write data into its configuration memory 52 based on control signals from the device controller 60. In addition to these operations, the sector controller 58 may be augmented with numerous additional capabilities. For example, such capabilities may include locally sequencing reads and writes to implement error detection and correction on the configuration memory 52 and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Each sector controller 58 thus may communicate with the device controller 60, which may coordinate the operations of the sector controllers 58 and convey commands initiated from outside the FPGA device 40. To support this communication, the interconnection resources 46 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable elements 50 may include one or more logic elements (wires, gates, registers, etc.). For example, during programming, configuration data is loaded into the configuration memory 52 using pins and input/output circuitry. In one example, the configuration memory 52 may be implemented as configuration random-access-memory (CRAM) cells. The use of configuration memory 52 based on RAM technology is described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may be applied to the gates of metal-oxide-semiconductor (MOS) transistors that control the states of the programmable logic elements 50 or programmable components of the interconnection resources 46.

The sector controllers 58 and/or the device controller 60 may determine when each sector controller 58 performs a CRAM read operation on the configuration memory 52 of its programmable logic sector 48. Each time the sector controller 58 performs a CRAM read of the configuration memory 52, power is drawn from the power distribution network 56. If too much power is drawn from the power distribution network 56 at any one time, the voltage provided by the power distribution network 56 could drop to an unacceptably low level, or too much noise could arise on the power distribution network 56. To avoid this, the device controller 60 and/or the sector controllers 58 may structure CRAM reads of the programmable logic sectors 48 to avoid excessive instantaneous power consumption by temporally and/or spatially distributing the CRAM reads across different programmable logic sectors 48.

The sector controller 58 of the programmable logic sector 48 is shown to read and write to the CRAM memory 52 by providing an ADDRESS signal to an address register and providing a memory write signal (WRITE), a memory read signal (RD DATA), and/or the data to be written (WR DATA) to a data register. These signals may be used to cause the data register to write data to or read data from a line of configuration memory 52 that has been activated along an address line, as provided by the ADDRESS signal applied to the address register. Memory read/write circuitry may be used to write data into the activated configuration memory 52 cells when the data register is writing data, and may be used to sense and read data from the activated configuration memory 52 cells when the data register is reading data.

Figure 3:
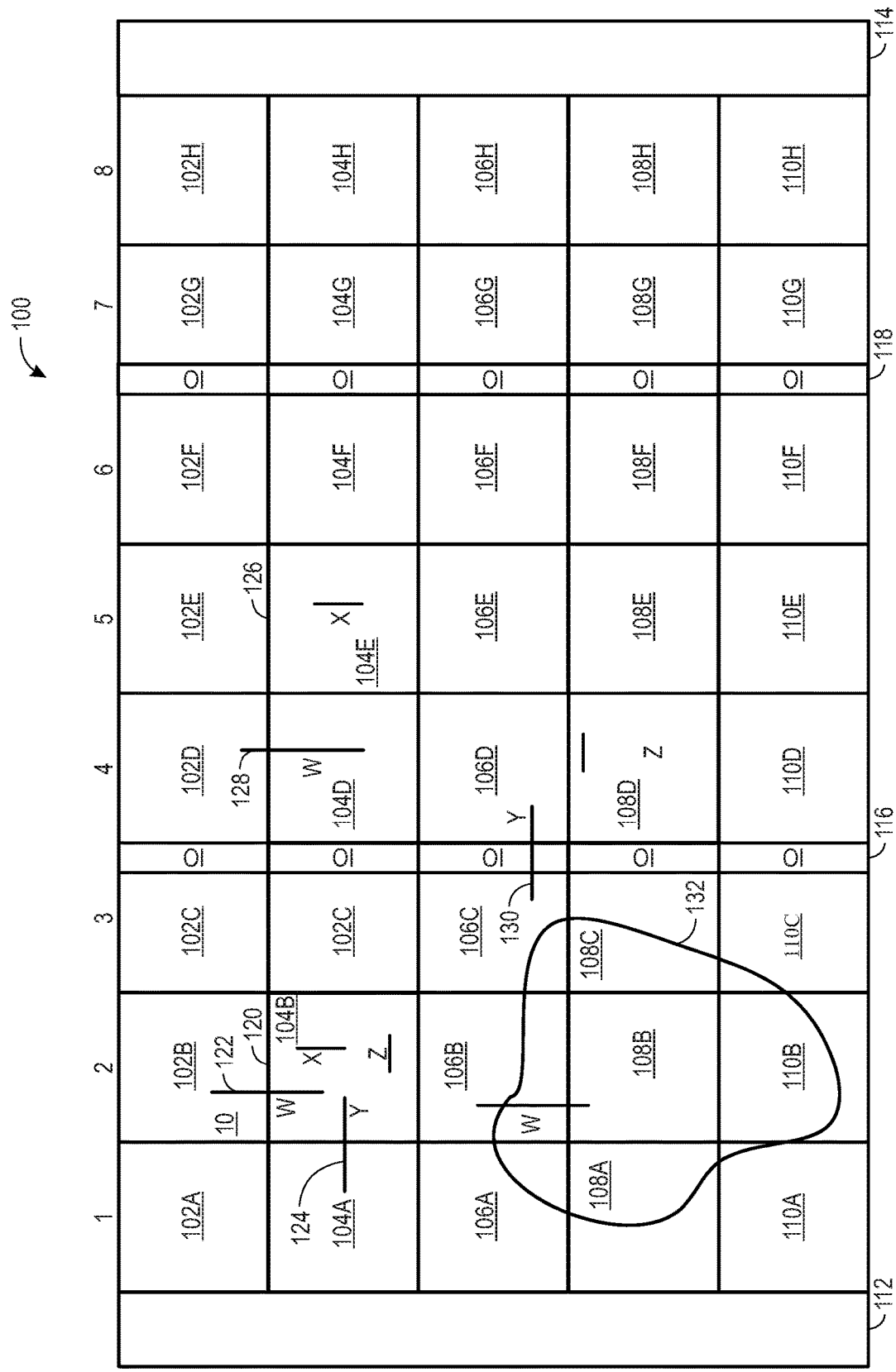
FIG. 3 is a block diagram view of the programmable fabric of the programmable logic device of FIG. 2, in accordance with an embodiment.

Programmable devices (e.g., FPGA 40) may be programmed in an initial configuration and/or may have portions of the programmable device that are reconfigured during operation of other portions of the programmable during a partial reconfiguration. FIG. 3 is a block diagram view of a programmable fabric 100. The programmable fabric 100 includes sectors 102a, 102b, 102c, 102d, 102e, 102f, 102g, and 102h, collectively referenced as sectors 102a-102h, in a first row. Similarly, the programmable fabric 100 includes sectors 104a, 104b, 104c, 104d, 104e, 104f, 104g, and 104h, collectively referenced as sectors 104a-104h, in a second row and includes sectors 106a, 106b, 106c, 106d, 106e, 106f, 106g, and 106h, collectively referenced as sectors 106a-106h, in a third row. Moreover, the programmable fabric 100 includes sectors 108a, 108b, 108c, 108d, 108e, 108f, 108g, and 108h, collectively referenced as sectors 108a-108h, in a fourth row, and sectors 110a, 110b, 110c, 110d, 110e, 110f, 110g, and 110h, collectively referenced as sectors 110a-110h, in a fifth row. Any of the sectors in any row, collectively referenced as sectors 102a-110h, may include a logical grouping of logical elements in the programmable fabric 100. For example, each sector of the sectors 102a-110h may include logic elements that are each capable of performing similar tasks. For example, each sector may include logic elements that would be typically be used in the programmable fabric 100 by each user or function.

Additionally or alternatively, some sectors of the sectors 102a-110h may perform different tasks. In some embodiments, rows or columns of the sectors 102a-110h may be directed to different functions. For example, sectors 102a and 104a may be suitable for a first function (e.g., digital signal processing, multiplication, etc.) while other sectors 102b and 102b may be suitable for a second function (e.g., custom LUT-based functions). Additionally or alternatively, multiple functions may be configured into each sector. Moreover, each sector 102a-110h may include local resources, such as configuration RAM, embedded RAM, magnetoresistive RAM, routing (e.g., wires, trace, etc.), registers, and/or clocking. In some embodiments, clocking may be shared between sectors. In such embodiments, the routing within each sector may be used to route clocking to relevant portions using a clock signal received at the sector from outside the sector.

Although the foregoing discusses and illustrates forty sectors, various embodiments may include more (e.g., 100) or less (e.g., 10) sectors. Moreover, the programmable fabric 100 may include any number of sectors depending any number of factors. Indeed, in some embodiments, a programmable device may include only a single sector since non-sectored programmable devices may be deemed to include a single sector. Thus, programmable devices may conceivably include any number of sectors from one to any number greater than one.

The programmable fabric 100 also includes global resources 112, 114, 116, and 118. The global resources 112, 114, 116, and 118 include resources that are shared between the sectors 102a-110h and outside of the physical regions of the sectors 102a-110h and/or partitions of the programmable fabric 100. These global resources 112, 114, 116, and 118 may include clock routing to each sector, phase lock loop (PLL) circuitry, input-output (IO) circuitry, Peripheral Component Interconnect Express (PCIe) circuitry, hardware platform interface (HPI), a hard processor system (HPS), and/or other suitable circuitry. The programmable fabric 100 may also include spanning resources that span physical partitions and/or sectors. These spanning resources may include a horizontal line and a vertical line utilized by the partition to pipe in data and/or output data. The spanning resources may also include scanning chains used for register readback from the partitions.

The programmable fabric 100 may also include partitions that may be directed to different functions, users, machines, permissions, or other divisions of the programmable device. As illustrated, some partitions, such as a partition 120, are entirely within and fully encompass a sector, such as sector 104e. The partition 120 utilize spanning resources 122 and 124 that extend into the partition 120 from sectors 102b and 104a, respectively. The programmable fabric 100 may also include partitions, such as partition 126, that spans multiple sectors, such as sectors 104d, 104e, 104f, 106d, 106e, 106f, 108d, 108e, and 108f. The partition 126 utilizes spanning resources 128 and 130. Some partitions, such as partition 132, extend beyond and/or do not fully encompass sectors in which the partition is located. For example, the partition 126 fully encompasses sector 108b and partially encompasses sectors 106a, 106b, 106c, 108a, 108c, 110a, 110b, and 110c.

As discussed below, resources within and/or spanning into a partition are managed by the system to ensure they are not modified by partitions that do not own them. The fundamental mechanism relies on the fact that configuration of a partition relies on a read/modify/write sequence that uses mask images that define the exact resources that are to be left un-modified. To provide guaranteed isolation, these mask images are manipulated and extended in order to prevent partitions from utilizing resources that do not belong to them.

To provide isolation between partitions, an "allowed" masks set for each partition may be generated to cover all resources that are owned by a partition. The masks identify both the sector and the resources used in that sector by a particular partition. For each sector there is then a set of masks that define the resources allocated and allowed for each partition. When a partition in a sector is updated, its allowed masks are merged with an inverted allowed masks (e.g., "Not Allowed") of other partitions in that sector to prevent that partition from affecting any resources in the sector (and other sectors) it does not own. The mask merging may be done statically at the time partitions are created and checked by a central authority that assigned the partitions. Additionally or alternatively, the masks may be merged at runtime by a device configuration system. Merging on the device allows resources owned within a partition to be modified without using mask merging action at a central server but consumes more resources on the programmable device.

Figure 4:
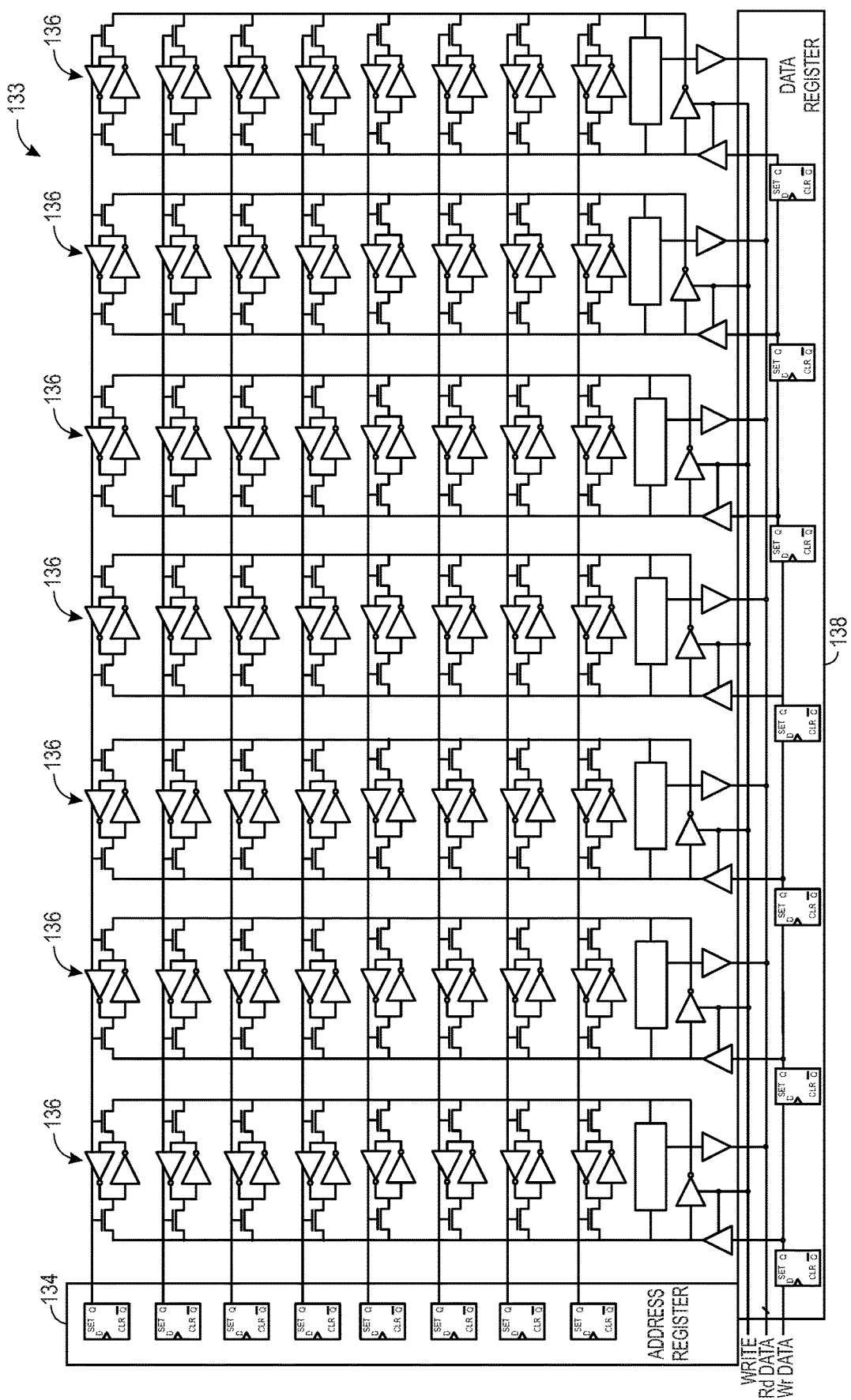
FIG. 4 illustrates a schematic diagram of a configuration RAM of the programmable fabric of FIG. 3, in accordance with an embodiment.

During a CRAM configuration, CRAM is written like typical memory by selecting an address of a word to be written in the CRAM. CRAM words, unlike some words in other memory types, may be thousands of bits wide. FIG. 4 illustrates a simplistic CRAM model 133 that includes an address register 134 that controls access to one or more rows of storage units 136 used to store data from a data register 138 when the address register 134 indicates that a respective storage unit 136 is to store data. The CRAM model 133 may include only a small fraction of CRAM included in a sector.

The data register 138 contains logic to load data to and/or from the CRAM and to shift in and out the data to be read or written to the CRAM. The data register 138 also contains logic and also the capability to perform arithmetic operations such as AND, OR, XOR, NOT, and/or Zero data stored in registers. The arithmetic operations allow read/modify/write functions so that individual bits in a CRAM word can be modified without affecting other bits in the word. This capability allows a region to be updated without effecting neighbor regions.

Partial reconfiguration of a region of the CRAM uses the arithmetic capability in a MASK/OR process. The MASK/OR involves using a mask to define the extent of the reconfigured region (e.g., an entire partition). This means that a configuration controller does not need to know the current state of the configuration nor map a "safe" reconfiguration (e.g., no shorts that may cause unwanted effects) from the current configuration to the target configuration. Instead, the configuration controller may reset the configuration then loading in a new configuration. As discussed below, the partial reconfiguration uses an image used as a mask, an x mask image, and a y mask image. An image is the set of words which are loaded into the data register and applied to the range of addresses of that region.

Figure 5:
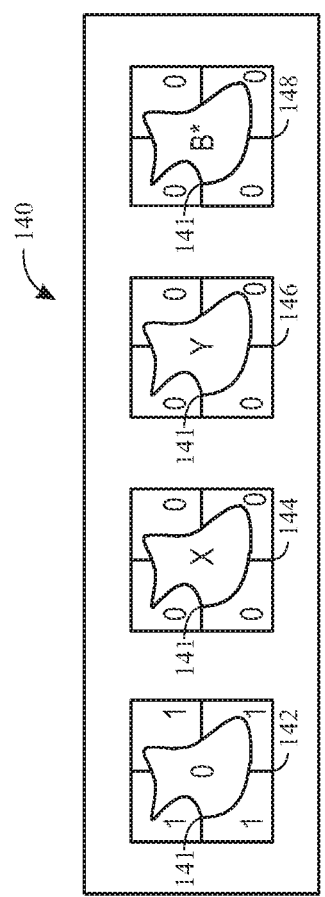
FIG. 5 illustrates reconfiguration masks for use in reconfiguration of the programmable fabric of FIG. 3, in accordance with an embodiment.

FIG. 5 illustrates reconfiguration masks 140 stored in memory for configuring a region 141 using a MASK/OR process. The reconfiguration masks include a zero mask 142 that zeroes out only the region to be reconfigured. As previously noted, using this zero mask 142 ensures that the programmable logic is reset to ensure that no connections are made to an incompletely configured region that may result in shorts that could cause undesired results from the programmable device. The reconfiguration masks 140 includes an x mask 144, a y mask 146, and a b* mask 148 each as examples including various configurations within the region 141.

Figure 6:
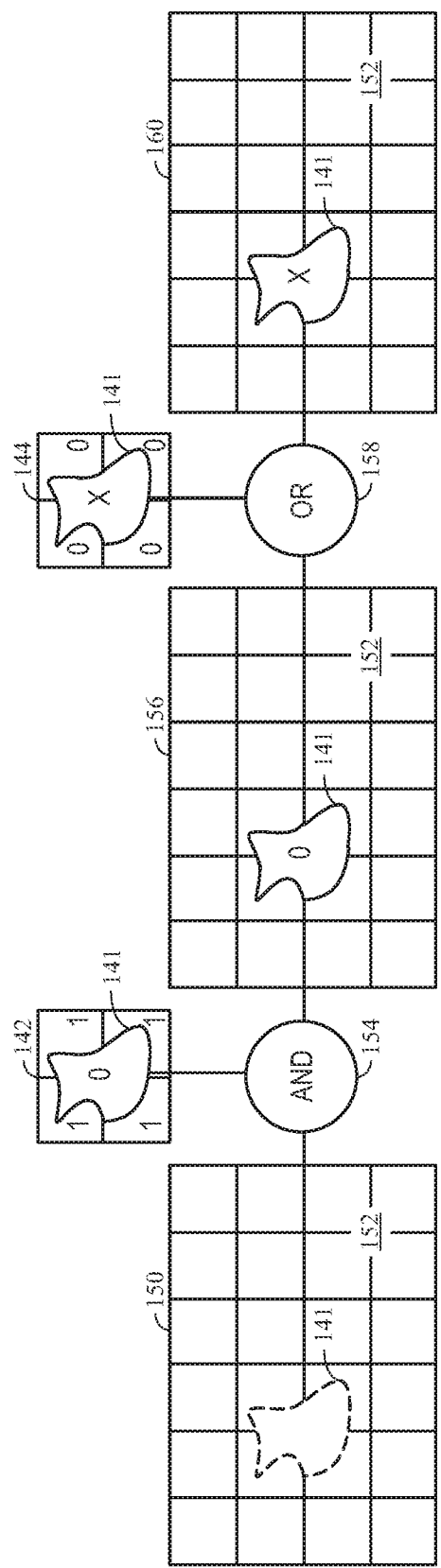
FIG. 6 is a flow diagram of a partial reconfiguration process using the reconfiguration masks of FIG. 5, in accordance with an embodiment.

FIG. 6 illustrates a block diagram view of the MASK/OR process of partially reconfiguring the programmable device in the region 141. A current configuration image 150 includes the region 141 to be reconfigured and remaining portion 152 that is not to be reconfigured. The current configuration image is AND'ed 154 with the zero mask 142 to zero out the region 141 without changing the remaining portion 152 of the programmable device. In other words, the zero mask 142 is used by the configuration controller to return the partial reconfiguration region 141 to zero through a read/modify/write. The zero mask has ones in each bit of each word that are to be left unmodified and a zero in the locations that are to be modified.

The AND 154 results in a zeroed-out configuration mask 156. The zeroed-out configuration mask 156 is OR'ed 158 with a configuration image, such as the x mask 144, to be written to the region 141 resulting in a reconfigured mask image 160. The x mask 144, as illustrated, contains a zero in the remaining portion 152 to be left un-modified and a one in the region 141 to be reconfigured. During the AND and the OR operations, the logic in the remaining portion 152 that is not in the region 141 remains unchanged. Although the foregoing discusses using a mask with one and zeros in specific locations with AND and OR logic, some embodiments may invert the ones and zeroes and use inversion logic, such as NANDs, NORs, and/or inversion gates.

If the zero mask 142 and the configuration masks 144, 146, and 148 are properly established, the configuration controller will not change resources that do not belong to a partition from being changed when the region 141 is being reconfigured. Moreover the zeros in the zero mask 142 represent the exact set of resources which belong to a partition.

Figure 7:
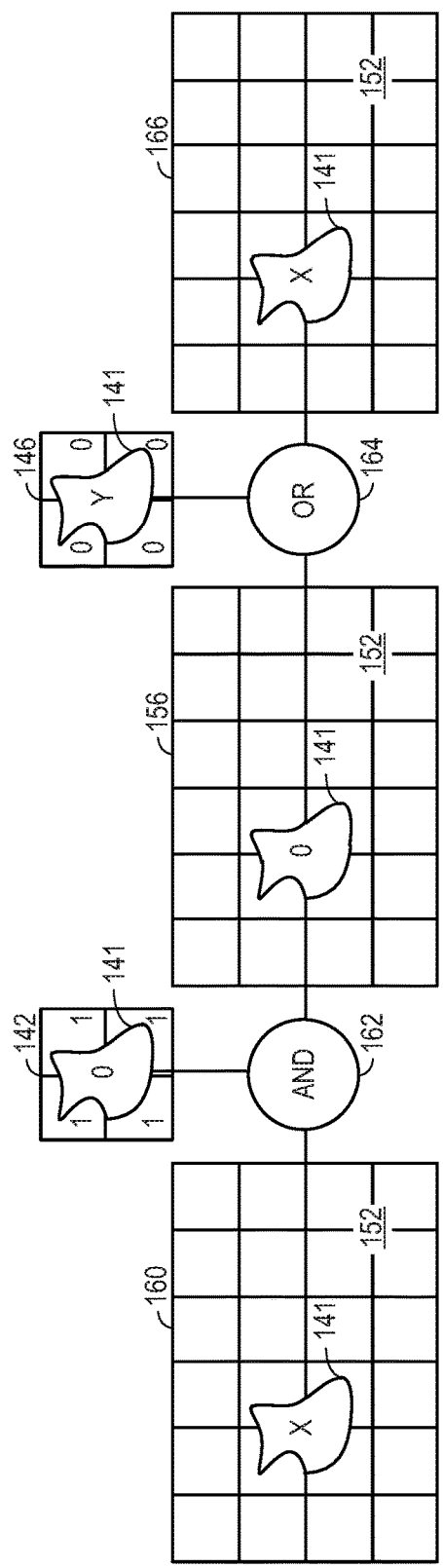
FIG. 7 is a flow diagram illustrating a partial reconfiguration process after the reconfiguration process of FIG. 6, in accordance with an embodiment.

FIG. 7 illustrates a block diagram view of a block diagram view of the MASK/OR process of partially reconfiguring the programmable device in the region 141 from the reconfigured mask image 160. The reconfigured mask image 160 is zeroed out using the zero mask 142 AND'ed 162 with the reconfigured mask image 160. This AND results in the zeroed-out configuration mask 156 that is OR'ed 164 with the y mask 146 to result in the y-configured image 166.

When a mask extends over partition boundaries, a new mask may be created. To create a mask that covers resources that traverse a partition boundary, an additional zero mask may be created for each sector to which the resource extends. These additional masks may be referred to as allowed masks. A set of not allowed masks for each sector may be created by inverting the zeros masks of all regions that may be loaded into a sector and AND'ing the masks together. The resulting mask has a 0 in every location that is not allowed to be modified when modifying the partition. To prevent a region 141 from changing another region, the not allowed mask is inverted and OR'ed with the zero mask and AND'ed with the to be written configuration mask (e.g., y mask 146) to create a new mask (e.g., reconfigured mask image 160).

The generation of masks can occur on a certified server or on the programmable device either at run time or before run time. For example, in some embodiments, the device (e.g., configuration controller) performs the merging of masks, signs the masks, and store them offchip in flash memory. Additionally or alternatively, the configuration controller can fetch the masks for all regions that intersect a sector and dynamically generate a new mask. The new mask can be generated in a system data manager (SDM) for the programmable device. Additionally or alternatively, the masks may be generated in place in the data register by sending the masks to the data register one at a time utilizing the arithmetic operations of the data register.

In some embodiments, the configuration system (e.g., SDM) may compare allowed masks of each region and report a violation of resource separation. In some embodiments, when the configuration system detects a violation, the configuration may halt configuration of the programmable device.

Local Resources

Embedded random accessible memory (ERAM) are individually addressable by the configurations system. The configuration system addresses them to a specific location with a packet header. To prevent un-authorized overwrites, an authenticated list of allowed ERAM address for each region may be loaded into the configuration system as an ordered list. The configuration system processor (e.g., SDM, local/sector managers) writes the packet header from the ordered list into the ERAM packet to ensure that writing only occurs to only authorized addresses.

Global Resources

Global resources are often configured once and not updated by partition updates. For example, global resources may include input/output ports (e.g., IO48), interfaces (e.g., high-speed serial interface—HSSI), hard processor systems (HPS), a clock network, and/or other resources shared between the partitions. Often, they are defined by a base partition at the time the set of partitions is defined. For global resources that are dynamically reconfigurable by the core logic, the base partition may claim the resources that provide access to the reconfiguration pathways.

Figure 8:
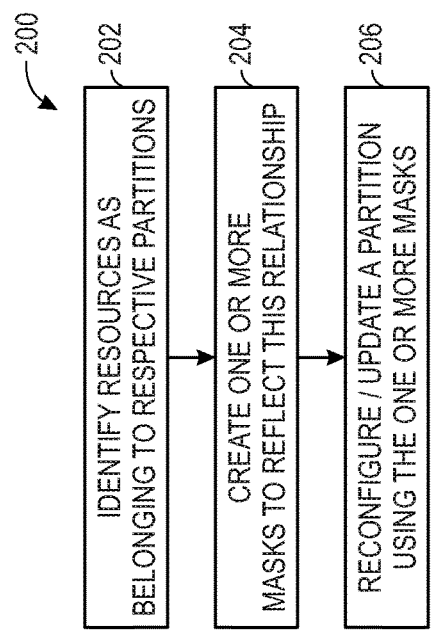
FIG. 8 is a flow diagram illustrating a process for partially reconfiguring a programmable fabric, in accordance with an embodiment.

FIG. 8 is a flow diagram of a process 200 for generating masks. First, resources are identified as belonging to respective partitions or regions (block 202). In some embodiments, the partitions may include a base partition that is assigned the global resources. Masks are created to describe this ownership (block 204). The masks may include allowed and not allowed masks to indicate resource ownership for the partition. The allowed mask images define local and spanning resources assigned to each partition. A local resource mask (including the local resources) is copied to a region partial reconfiguration mask (e.g., x mask 144). Spanning resources masks (including a set of horizontal and/or vertical lines) add to the region partial reconfiguration mask resources that are used by the region 141 to enter and exit the region 141. A central authority may define the existence of the partitions and set ownership of resources. For example, this central authority may be a server owner and/or operator. The mask images may also be signed by the central authority at time of generation. Additionally or alternatively, the masks may be signed by the partition owner (e.g., virtual machine client/user) when the partition is assigned to the partition owner.

During runtime, a partition is updated using the masks (block 206). The masks also include allowed masks. The masks for a partition include a not-allowed mask that is the inverted allowed masks of all potentially intersecting regions. This not-allowed mask is combined (e.g., in the hardware) with the reconfiguration masks of the partition to be updated to create a new reconfiguration mask that prevents changing the state of resources that a partition does not own. When the programmable device is sectorized, the number of potentially intersecting partitions is relatively low. When each partition is within a sector, the number of potentially intersecting partitions may be completely eliminated.

At least a portion of the foregoing process may be implemented using tangible, non-transitory, and computer-readable medium that has instructions stored thereon. These instructions may be executed by the server, the configuration controller, and/or any other suitable processor.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A method for configuring a programmable device, comprising:
   identifying a resource in a programmable fabric of the programmable device as belonging to a partition;
   creating an indication of which portion of the partition the identified resource belongs; and
   reconfiguring the identified resource, via a configuration controller, in the programmable fabric based at least in part on the indication without changing an additional resource associated with another partition in the programmable fabric, wherein the identified resource is reconfigured at runtime of the programmable device after configuration data is received by the programmable device.

2. The method of claim 1, wherein identifying the resource in the programmable fabric comprises assigning a global resource used by multiple partitions to a base partition.

3. The method of claim 2, wherein the global resource comprises an input/output port, an interface, a hard processor system, a clock network, or any combination thereof.

4. The method of claim 1, wherein the identified resource comprises a plurality of resources local to the partition.

5. The method of claim 4, wherein the plurality of resources local to the partition comprises configuration random access memory, embedded random accessible memory, routing, or any combination thereof.

6. The method of claim 1, wherein the identified resource comprises a resource that spans partitions by entering or exiting the partition.

7. The method of claim 6, wherein the resource that spans partitions comprises a resource horizontally entering the partition, horizontally exiting the partition, vertically entering the partition, vertically exiting the partition, or any combination thereof.

8. The method of claim 1, wherein the partition comprises one of a plurality of partitions in the programmable device.

9. The method of claim 1, wherein the creating of the indication of which portion of the partition the identified resource belongs comprises identifying an inverse of the indication.

10. The method of claim 9, wherein reconfiguring the identified resource without changing the additional resource comprises reconfiguring the identified resource while holding the additional resource constant within the portion of the partition corresponding to the inverse of the indication.

11. The method of claim 1, wherein reconfiguring the partition comprises loading a partition of a configuration memory corresponding to the partition with a default configuration based at least in part on the indication.

12. The method of claim 11, wherein setting the configuration memory corresponding to the partition to a default configuration comprises zeroing out the configuration memory corresponding to the partition.

13. An integrated circuit device, comprising:
a programmable fabric comprising a plurality of partitions; and
a configuration controller configured to:
generate an indication configured to specify resources belonging to a partition of the plurality of partitions; and
reconfiguring resources of the programmable fabric associated with the partition without changing resources associated with other partitions of the plurality of partitions in the programmable fabric based at least in part on the indication, and wherein the resources are reconfigured at runtime of the integrated circuit device after configuration data is received by the integrated circuit device.

14. The integrated circuit device of claim 13, comprising a server, wherein the server comprises the programmable fabric.

15. The integrated circuit device of claim 13, comprising a field programmable gate array that comprises the programmable fabric.

16. The integrated circuit device of claim 13, wherein the indication is configured to identify a portion of the resources of the programmable fabric that is permitted to change with the partition of the plurality of partitions.

17. The integrated circuit device of claim 16, wherein the resources of the programmable fabric that are not permitted to change are identified based at least in part on an inversion operation performed on the indication.

18. A tangible, non-transitory, and machine-readable medium, comprising machine-readable instructions stored thereon that when executed cause a processor to:
receive an indication of a partition of a plurality of partitions of a programmable fabric of a programmable device that is to be reconfigured, wherein the indication specifies one or more identified resources as belonging to the partition; and
configure the partition using the indication, wherein the identified resources are changed at runtime using the indication after configuration data is received by the programmable device.

19. The tangible, non-transitory, and machine-readable medium of claim 18, wherein the instructions are configured to cause the processor to generate the indication at runtime of the programmable fabric.

20. The tangible, non-transitory, and machine-readable medium of claim 18, wherein the instructions are configured to cause the processor to remove connections between the identified resources corresponding to the indication by resetting a portion of a configuration memory corresponding to the partition prior to configuring the partition.

* * * * *